US010665780B2

United States Patent
Liu et al.

(10) Patent No.: US 10,665,780 B2
(45) Date of Patent: May 26, 2020

(54) SELECTION DEVICE FOR USE IN BIPOLAR RESISTIVE MEMORY AND MANUFACTURING METHOD THEREFOR

(71) Applicant: INSTITUTE OF MICROELECTRONICS, CHINESE ACADEMY OF SCIENCES, Beijing (CN)

(72) Inventors: Ming Liu, Beijing (CN); Qing Luo, Beijing (CN); Xiaoxin Xu, Beijing (CN); Hangbing Lv, Beijing (CN); Shibing Long, Beijing (CN); Qi Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/085,400

(22) PCT Filed: Mar. 18, 2016

(86) PCT No.: PCT/CN2016/076667
§ 371 (c)(1),
(2) Date: Sep. 14, 2018

(87) PCT Pub. No.: WO2017/156755
PCT Pub. Date: Sep. 21, 2017

(65) Prior Publication Data
US 2019/0115529 A1    Apr. 18, 2019

(51) Int. Cl.
*H01L 29/51*    (2006.01)
*H01L 45/00*    (2006.01)
(Continued)

(52) U.S. Cl.
CPC .............. *H01L 45/06* (2013.01); *G11C 11/56* (2013.01); *G11C 13/0007* (2013.01);
(Continued)

(58) Field of Classification Search
CPC ......... H01L 27/10838; H01L 28/40–92; H01L 27/0288; H01L 27/1082; H01L 27/1084;
(Continued)

(56) References Cited

FOREIGN PATENT DOCUMENTS

| CN | 101101960 A | 1/2008 |
|----|-------------|--------|
| CN | 101179095 A | 5/2008 |

(Continued)

OTHER PUBLICATIONS

International Search Report for International Application No. PCT/CN2016/076667 dated Nov. 30, 2016.

*Primary Examiner* — Cuong B Nguyen
(74) *Attorney, Agent, or Firm* — Goodwin Procter LLP

(57) ABSTRACT

A selector for a bipolar resistive random access memory and a method for fabricating the selector are provided. The method includes: providing a substrate; forming a lower electrode on the substrate, where the lower electrode is made of a metal, and the metal is made up of metal atoms which diffuse under an annealing condition of below 400° C.; forming a first metal oxide layer on the lower electrode; performing an annealing process on the first metal oxide layer to make the metal atoms in the lower electrode diffuse into the first metal oxide layer to form a first metal oxide layer doped with metal atoms; forming a second metal oxide layer on the first metal oxide layer doped with metal atoms; forming an upper electrode layer on the second metal oxide layer; and patterning the upper electrode layer to form an upper electrode.

8 Claims, 9 Drawing Sheets

(51) Int. Cl.
*H01L 27/24* (2006.01)
*G11C 13/00* (2006.01)
*G11C 11/56* (2006.01)

(52) U.S. Cl.
CPC .......... *H01L 27/24* (2013.01); *H01L 27/2409* (2013.01); *H01L 29/51* (2013.01); *H01L 45/00* (2013.01); *H01L 45/085* (2013.01); *H01L 45/1233* (2013.01); *H01L 45/146* (2013.01); *H01L 45/16* (2013.01); *H01L 45/1633* (2013.01); *G11C 2213/15* (2013.01); *G11C 2213/73* (2013.01)

(58) Field of Classification Search
CPC . H01L 27/1085–10867; H01L 27/0635; H01L 27/0647; H01L 27/0652; H01L 27/0658; H01L 27/067; H01L 27/0711; H01L 27/075; H01L 27/0755; H01L 27/0777; H01L 27/0783; H01L 27/0629; H01L 27/0676; H01L 27/0716; H01L 27/0722; H01L 27/0727; H01L 27/0733; H01L 27/0788; H01L 27/0794; H01L 27/1255; H01L 27/3265
See application file for complete search history.

(56) References Cited

FOREIGN PATENT DOCUMENTS

| | | |
|---|---|---|
| CN | 101997083 A | 3/2011 |
| CN | 103794621 A | 5/2014 |

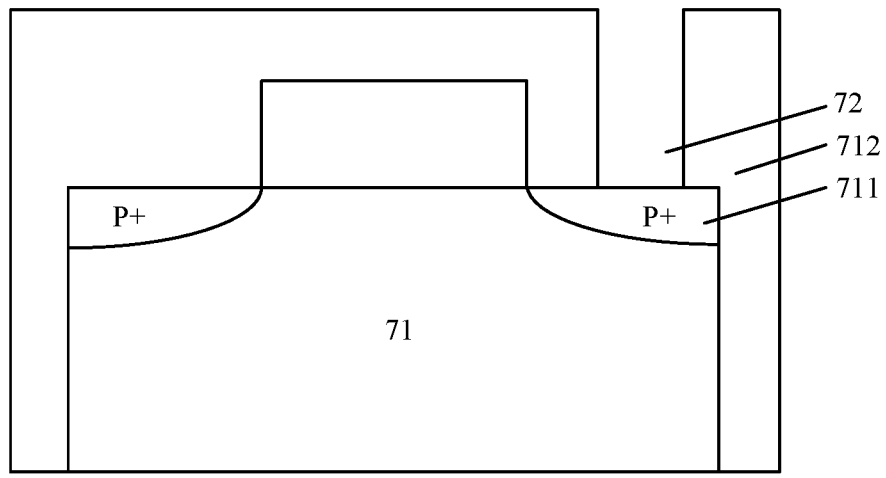
Figure 7B1
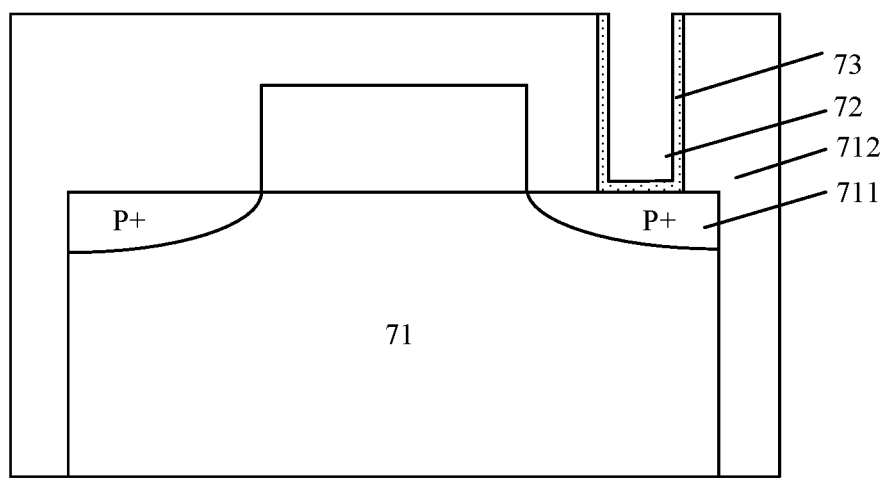
Figure 7B2

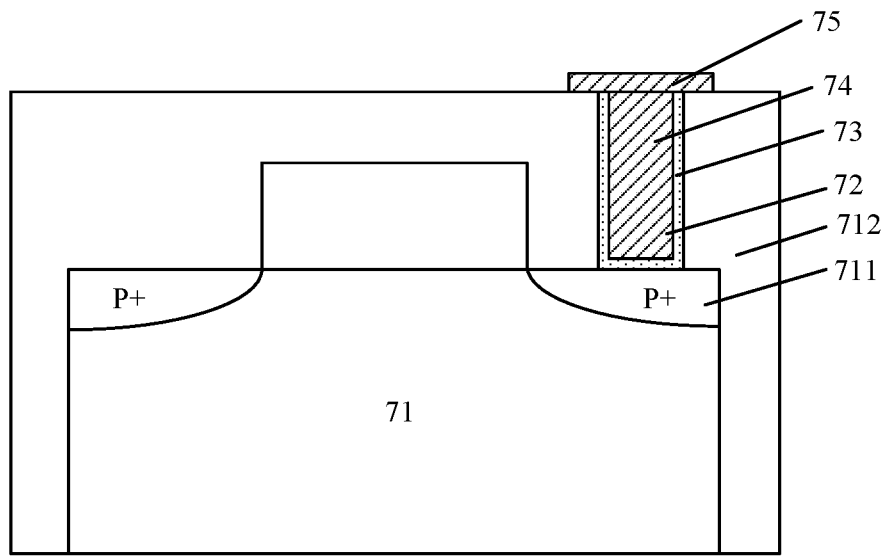
Figure 7B3
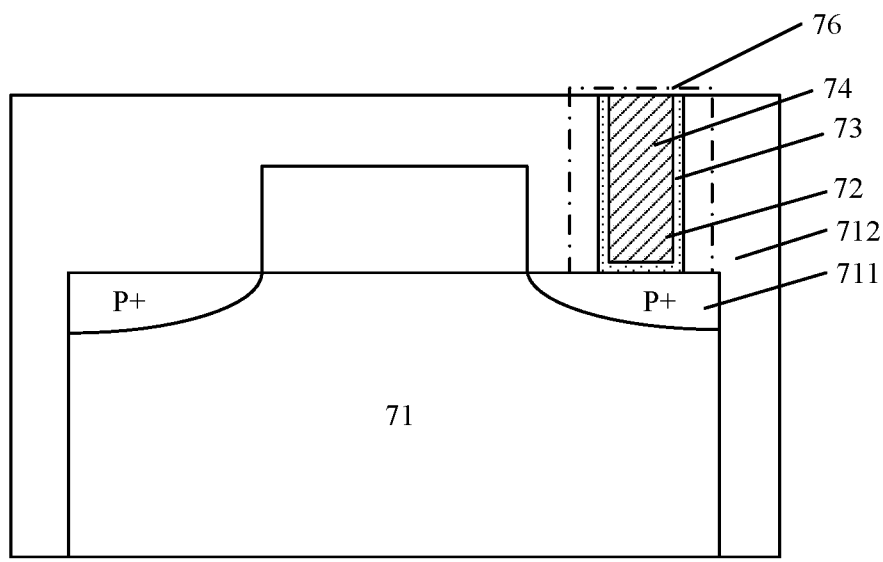
Figure 7B4

SELECTION DEVICE FOR USE IN BIPOLAR RESISTIVE MEMORY AND MANUFACTURING METHOD THEREFOR

CROSS-REFERENCE OF RELATED APPLICATION(S)

The present application is the U.S. national stage application of, and claims priority to, International Application No. PCT/CN2016/076667, filed on Mar. 18, 2016, which is incorporated herein by reference in its entirety.

FIELD

The present disclosure relates to the technical field of semiconductor device fabrication, and in particular to a selector for a bipolar resistive random access memory and a method for fabricating the selector.

BACKGROUND

A semiconductor memory may be classified into two types depending on whether it can hold the stored information when it loses power: a volatile memory and a non-volatile memory. With the popularity of portable electronic devices, the non-volatile memory has become more and more important in the memory market. Although the current FLASH technology is the mainstream of the non-volatile memory market, with the advancing of the semiconductor technical node, the FLASH technology is experiencing a series of bottlenecks such as a high operating voltage, a size that cannot be reduced, and a short holding time. It is reported that the limitation of the FLASH technology is around 16 nm. The scientific community and industry are looking for a next-generation non-volatile memory that can replace the FLASH technology. A Resistive Random Access Memory (RRAM) has become a research focus of the new non-volatile memory due to advantages of a low operating voltage, non-destructive read, a fast operation speed, a simple structure, easy integration, and the like. However, there is a serious crosstalk problem in the resistive random access memory array. Such crosstalk problem becomes more serious as the array expands, seriously affecting the reliability of the resistive random access memory and hindering its application.

At present, methods for solving the crosstalk problem of the resistive random access memory include: integrating a resistive random access memory with a MOS transistor (the 1T1R structure), connecting a resistive random access memory with an external diode (the 1D1R structure), and connecting a resistive random access memory with a selector in series (the 1S1R structure). In the 1T1R structure, since an area of a memory unit mainly depends on an area of the transistor, advantages of the simple structure and the small device area of RRAM cannot be given full play. The 1D1R is weak in limiting the leakage current as compared with the 1S1R. Therefore, the 1S1R structure is ideal to solve the crosstalk problem at present.

In the resistive random access memory having the 1S1R structure, a selector having a high current density, a high selection ratio and high durability is beneficial in improving the performance of the resistive random access memory having the 1S1R structure.

SUMMARY

In view of this, a selector for a bipolar resistive random access memory and a method for fabricating a selector for a bipolar resistive random access memory are provided according to the present disclosure, so as to increase a current density, a selection ratio and durability of a selector.

In order to solve the above technical problems, the present disclosure adopts following technical solutions.

A method for fabricating a selector for a bipolar resistive random access memory is provided. The method includes: providing a substrate; forming a lower electrode on the substrate, where the lower electrode is made of a metal, and the metal is made up of metal atoms which diffuse under an annealing condition of below 400° C.; forming a first metal oxide layer on the lower electrode; performing an annealing process on the first metal oxide layer so as to make the metal atoms in the lower electrode diffuse into the first metal oxide layer to form a first metal oxide layer doped with metal atoms; forming a second metal oxide layer on the first metal oxide layer doped with metal atoms; forming an upper electrode layer on the second metal oxide layer; and patterning the upper electrode layer to form an upper electrode.

Optionally, the first metal oxide layer or the second metal oxide layer is made of at least one of $HfO_2$, $Al_2O_3$, $TaO_x$ and $TiO_x$.

Optionally, the first metal oxide layer or the second metal oxide layer has a thickness ranging from 2 nm to 4 nm.

Optionally, the annealing process is performed for 20 min to 40 min.

Optionally, the annealing process is performed in an atmosphere of air.

Optionally, the annealing process is performed at a temperature below 400° C.

Optionally, the metal is copper, silver or titanium.

Optionally, a MOS transistor is provided on the substrate, the MOS transistor includes a source/drain, and the forming the lower electrode on the substrate includes: forming a bolt hole on the source/drain of the MOS transistor through photolithography and etching; forming a diffusion barrier layer on a side wall of the bolt hole; filling the bolt hole with a metal, such that the bolt hole is fully filled with the metal, and a metal layer is formed on the bolt hole; and performing chemical-mechanical planarization on the metal layer to form a metal plug, where the metal plug is the lower electrode.

A selector for a bipolar resistive random access memory is further provided. The selector includes: a substrate, a lower electrode, a first metal oxide layer doped with metal atoms, a second metal oxide layer and an upper electrode.

The lower electrode is formed on the substrate, where the lower electrode is made of a metal, and the metal is made up of metal atoms which diffuse under an annealing condition of below 400° C.

The first metal oxide layer doped with metal atoms is formed on the lower electrode.

The second metal oxide layer is formed on the first metal oxide layer doped with metal atoms.

The upper electrode is formed on the second metal oxide layer.

Optionally, the first metal oxide layer or the second metal oxide layer is made of at least one of $HfO_2$, $Al_2O_3$, $TaO_x$ and $TiO_x$.

Optionally, the first metal oxide layer or the second metal oxide layer has a thickness ranging from 2 nm to 4 nm.

Optionally, the metal is copper, silver or titanium.

Compared with the conventional technology, the present disclosure has the following beneficial effects.

It may be known from the above technical solutions that in the selector provided according to the present disclosure, the first metal oxide layer doped with metal atoms is equivalent to a selection function layer of the selector, a band gap width of the first metal oxide layer doped with metal atoms is reduced sharply compared with that of a metal oxide layer not doped with metal atoms. The metal atoms are arranged in an ordered manner in the metal oxide doped with metal atoms when there is an electric field, and restore the disordered arrangement when a voltage is reduced or a voltage is removed, hence a current is great under a high voltage, and a current under a low voltage is a hundred times smaller than the current under the high voltage. Therefore, conductivity of the first metal oxide layer doped with metal atoms is enhanced. The second metal oxide layer is equivalent to a tunneling layer of the selector. The second metal oxide layer facilitates reduction of the leakage current of a selector, such that the nonlinear ratio of the selector can be increased. In this way, the selector provided according to the present disclosure can provide the high current density, and the crosstalk phenomenon in a resistive random access memory array can be effectively suppressed with the 1S1R structure formed by connecting the selector and the resistive random access memory in series. Further, the selector has a high selection ratio and high durability.

Moreover, with the selector provided according to the present disclosure, a storage density can be effectively increased without increasing an area of the memory unit, such that the integration degree of the device can be improved.

BRIEF DESCRIPTION OF THE DRAWINGS

The drawings to be used in the description of the embodiments of the present disclosure are described briefly as follows, so that the embodiments of the present disclosure become clearer. It is apparent that the drawings in the following description only illustrate some embodiments of the present disclosure. For those skilled in the art, other drawings may be obtained without any creative work.

FIGS. 7A to 7F are cross-sectional views illustrating structures corresponding to a series of fabrication processes of the method for fabricating a selector for a bipolar resistive random access memory according to the second embodiment of the present disclosure.

DETAILED DESCRIPTION OF EMBODIMENTS

Figure 1:
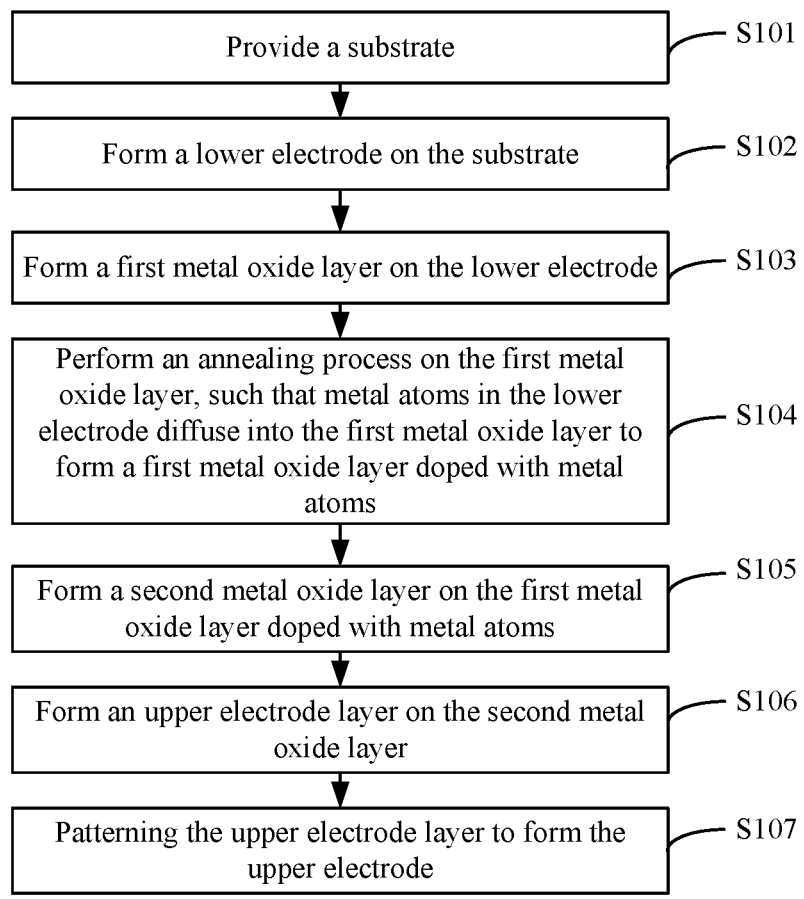
FIG. 1 is a flow chart of a method for fabricating a selector for a bipolar resistive random access memory according to a first embodiment of the present disclosure.

In order to make a purpose, a technical scheme and a technical effect of the disclosure more clear and complete, embodiments of the present disclosure are described in detail below in conjunction with the drawings.

For clarity, thicknesses of layers and areas are enlarged in the drawings, but as a schematic diagram, it should not be considered to strictly reflect a proportional relationship of geometric dimensions.

Drawings herein are schematic diagrams of idealized embodiments of the present disclosure, and the embodiment of the present disclosure should not be considered to be limited to a particular shape of the area shown in the drawings, but include shapes resulted from, for example, deviations caused by manufacture. For example, a curve obtained by a dry etching process generally has a feature of being curved or rounded, but in the drawings of the embodiments of the present disclosure, it is represented by rectangles. The representation in the drawings is schematic, but this should not be considered as limiting the scope of the present disclosure.

First Embodiment

FIG. 1 is a flow chart of a method for fabricating a selector for a bipolar resistive random access memory according to an embodiment of the present disclosure. As shown in FIG. 1, the fabrication method includes the following steps S101 to S107.

In step S101, a substrate is provided.

Figure 2A:
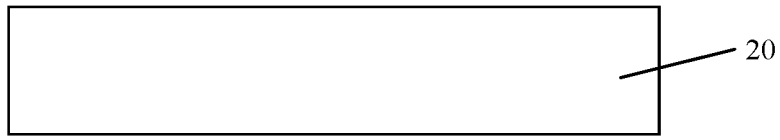
FIGS. 2A to 2F are schematic diagrams illustrating structures corresponding to a series of fabrication processes of the method for fabricating a selector for a bipolar resistive random access memory according to the first embodiment of the present disclosure.

FIG. 2A is a cross-sectional view illustrating a structure corresponding to this fabrication process. A substrate 20 described in the embodiment of the present disclosure may be a substrate commonly used in the art, such as a silicon substrate. Moreover, the substrate 20 may further include but is not limited to other semiconductors or compound semiconductors, such as SiC, and GaAs.

In step S102, a lower electrode is formed on the substrate. The lower electrode is made of metal.

Figure 2B:
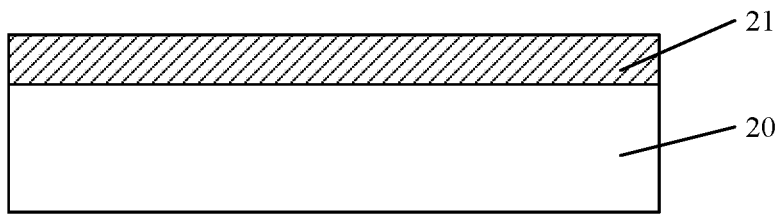

FIG. 2B is a cross-sectional view illustrating a structure corresponding to this fabrication process. As shown in FIG. 2B, a lower electrode 21 is formed on the substrate 20. The lower electrode is made of a metal. The metal is made up of atoms which diffuse under an annealing condition of below 400° C. As an example, the metal may be copper, silver or titanium.

In step S103, a first metal oxide layer is formed on the lower electrode.

Figure 2C:
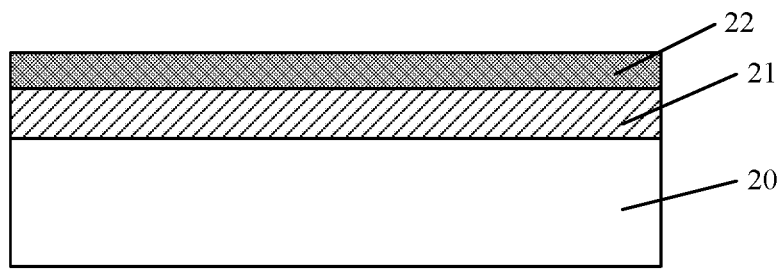

FIG. 2C is a cross-sectional view illustrating a structure corresponding to this fabrication process. A first metal oxide layer 22 is formed on the lower electrode 21.

The first metal oxide layer may be formed by metal oxide. As an example, the metal oxide may be at least one of $HfO_2$, $Al_2O_3$, $TaO_x$ and $TiO_x$. In the embodiment of the present disclosure, a thickness of the first metal oxide layer 22 may range from 2 nm to 4 nm and is preferably 2 nm.

The first metal oxide layer 22 functions to make a current-voltage relation of the selector nonlinear.

In step S104, an annealing process is performed on the first metal oxide layer so as to make metal atoms in the lower electrode diffuse into the first metal oxide layer to form a first metal oxide layer doped with metal atoms.

Figure 2D:
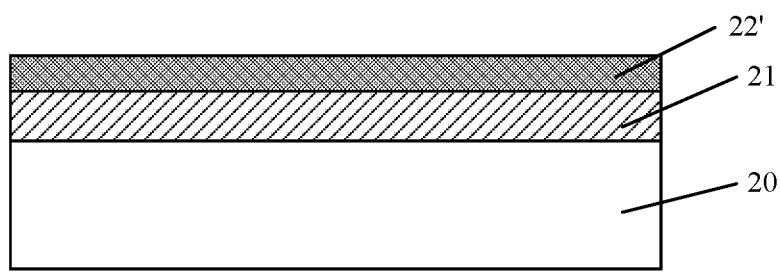

FIG. 2D is a cross-sectional view illustrating a structure corresponding to this fabrication process.

In order to increase a selection ratio of the first metal oxide layer, the annealing process is performed on the first metal oxide layer 22 in this step. In the annealing process, the metal atoms in the lower electrode 21 under the first metal oxide layer 22 are activated, and diffuse into the first metal oxide layer 22, thereby forming a first metal oxide layer 22' doped with metal atoms. The formed first metal oxide layer 22' doped with metal atoms is equivalent to a selection function layer of the selector.

It should be noted that, in order that the method for fabricating the selector is compatible with a CMOS process, the annealing process is performed at a temperature below 400° C. in the present disclosure.

As an example, the annealing process may be performed under the following condition: the annealing process is performed at a temperature between 100° C. and 150° C. for 20 minutes to 40 minutes. Optionally, the annealing process may be performed for 30 minutes in an atmosphere of air.

Since the first metal oxide layer is made of metal oxide, when the metal atoms diffuse into the first metal oxide layer to form the first metal oxide layer 22' doped with metal atoms, a band gap width of the metal oxide doped with metal atoms may be reduced sharply. The metal atoms are arranged in an ordered manner in the metal oxide doped with metal atoms (it is to be noted that the metal atoms do not form a stable metal wire) when there is an electric field, and restore the disordered arrangement when a voltage is reduced or a voltage is removed, hence a current is great under a high voltage, and a current under a low voltage is a hundred times smaller than the current under the high voltage. Therefore, when there is an external electric field, the metal atoms are arranged in an ordered manner in the metal oxide, a conductive circuit may be formed in the ordered circuit formed by the metal atoms, and when the electric field disappears, the metal atoms scatter due to stress and other effects, and the conductive circuit disappears.

In step S105, a second metal oxide layer is formed on the first metal oxide layer doped with metal atoms.

Figure 2E:
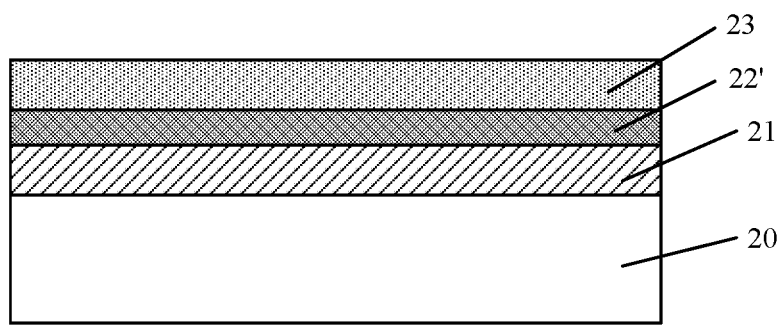

FIG. 2E is a cross-sectional view illustrating a structure corresponding to this fabrication process.

As an example, in the present disclosure, a second metal oxide layer 23 may be formed on the first metal oxide layer 22' doped with metal atoms by magnetron sputtering. The second metal oxide layer 23 may be made of metal oxide. As an example, the metal oxide may be at least one of $HfO_2$, $Al_2O_3$, $TaO_x$ and $TiO_x$. In the embodiment of the present disclosure, the second metal oxide layer 23 may have a thickness ranging from 2 nm to 4 nm.

In the embodiment of the present disclosure, the second metal oxide layer 23 is equivalent to a tunneling layer of the selector and mainly functions to reduce the leakage current of the selector to be fabricated such that a nonlinear ratio of the selector is increased and the leakage current of the selector is decreased.

In order to more clearly illustrate the function of the second metal oxide layer, the following comparison experiment is provided in the embodiment of the present disclosure.

In a first experiment, an upper electrode is directly formed on the doped first metal oxide layer, and a current-voltage relation of the selector fabricated by this method is tested. That is, the current-voltage relation of the lower electrode/the doped first metal oxide layer/the upper electrode structure is tested. The obtained current-voltage relation is as shown in FIG. 3.

In a second experiment, the upper electrode is formed on the second metal oxide layer, and a current-voltage relation of the selector fabricated by this method is tested. That is, the current-voltage relation of the lower electrode/the doped first metal oxide layer+the second metal oxide layer/the upper electrode structure is tested. The obtained current-voltage relation is as shown in FIG. 4.

Figure 3:
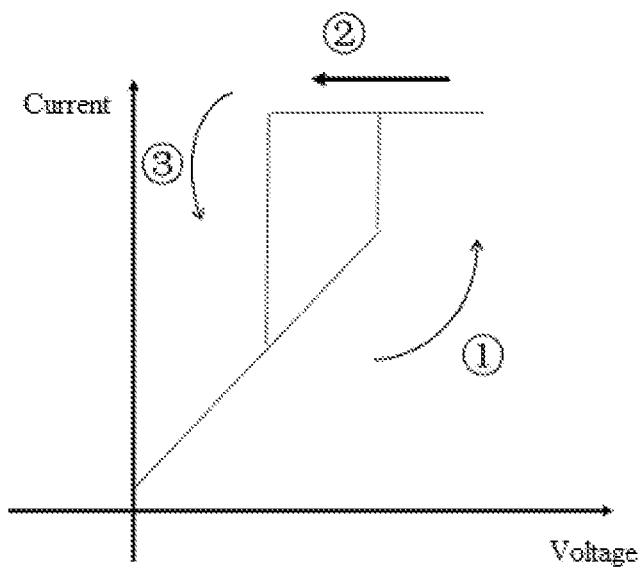
FIG. 3 is a schematic diagram of a current-voltage relation of a lower electrode/a doped selection function layer/an upper electrode structure obtained from an experiment according to an embodiment of the disclosure.
Figure 4:
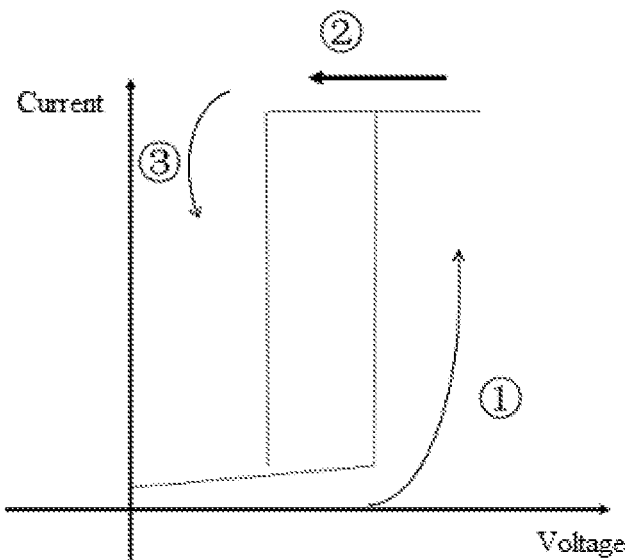
FIG. 4 is a schematic diagram of a current-voltage relation of a lower electrode/a doped selection function layer+a second metal oxide layer/an upper electrode structure obtained from an experiment according to an embodiment of the present disclosure.

As shown in FIGS. 3 and 4, a curve segment ① represents a procedure in which the current rises with the voltage, a curve segment ② represents a procedure in which the current remains constant as the voltage drops, a curve segment ③ represents a procedure in which the current sharply drops. A slope of the curve segment ① represents the magnitude of the leakage current, where a greater slope corresponds to a greater magnitude of the leakage current. It may be known from FIGS. 3 and 4, the slope of the curve segment ① in FIG. 4 is less than the slope of the curve segment ① in FIG. 9. Hence, the leakage current of the selector provided with the second metal oxide layer is smaller. Therefore, in the embodiment of the present disclosure, the leakage current of the selector may be reduced by providing the second metal oxide layer, such that the nonlinear ratio of the selector can be increased.

It should be noted that in the embodiment of the present disclosure, the doped first metal oxide layer and the second metal oxide layer together form the selection function layer of the selector. This two-layered structure functions to increase the nonlinear ratio of the selector.

In step S106, an upper electrode layer is formed on the second metal oxide layer.

Figure 2F:
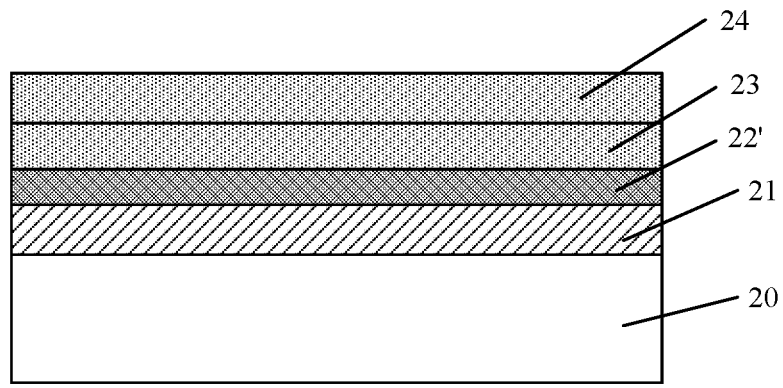

FIG. 2F is a cross-sectional view illustrating a structure corresponding to this fabrication process. An upper electrode layer 24 is formed on the second metal oxide layer 23.

In the embodiment of the present disclosure, the upper electrode layer 24 may be formed on the second metal oxide layer 23 by magnetron sputtering. The upper electrode layer 24 may be made of at least one of metal materials Pt, W, Ru and Al, or may be made of at least one of conductive metal compounds TiN, TaN, $IrO_2$, ITO and IZO.

As a specific embodiment of the present disclosure, the upper electrode layer 24 may be formed on the second metal oxide layer 23 by any one of an electron beam evaporation method, a chemical vapor deposition method, a pulsed laser deposition method, an atomic layer deposition method, and a sputtering method. The formed upper electrode layer 24 may have a thickness ranging from 30 nm to 200 nm.

In step S107, the upper electrode layer is patterned to form the upper electrode.

A specific embodiment of the method for manufacturing a selector for a bipolar resistive random access memory according to the first embodiment of the present disclosure is described above. Based on the fabrication method, a selector for a bipolar resistive random access memory is further provided according to an embodiment of the present disclosure. The schematic structural diagram of the selector is as shown in FIG. 2F. The selector includes a substrate 20, a lower electrode 21, a first metal oxide layer 22' doped with metal atoms, a second metal oxide layer 23 and an upper electrode 24.

The lower electrode 21 is formed on the substrate 20. The lower electrode is made of a metal. The metal is made up of atoms which diffuse under an annealing condition of below 400° C.

The first metal oxide layer 22' doped with metal atoms is formed on the lower electrode 21.

The second metal oxide layer 24 is formed on the first metal oxide layer 22' doped with metal atoms.

The upper electrode 24 is formed on the second metal oxide layer.

Optionally, the metal is copper, silver or titanium.

Figure 5:
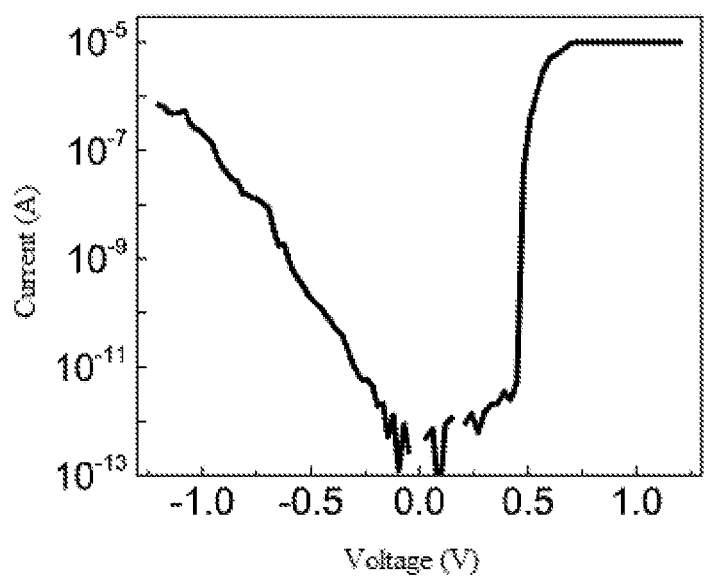
FIG. 5 is a schematic diagram of a current-voltage relation of a selector in which a first metal oxide layer and a second metal oxide layer are made of $HfO_2$.

FIG. 5 illustrates a current-voltage relation of a selector in which a first metal oxide layer and a second metal oxide layer are made of $HfO_2$. It may be known from FIG. 5 that the selector for a bipolar resistive random access memory provided in the embodiment of the present disclosure has basic properties of a typical selector.

The method for fabricating a selector for a bipolar resistive random access memory according to the first embodiment of the present disclosure is described above. In the specific embodiment, the first metal oxide layer doped with metal atoms is equivalent to a selection function layer of the selector, a band gap width of the first metal oxide layer doped with metal atoms is reduced sharply compared with that of a metal oxide layer not doped with metal atoms. The metal atoms are arranged in an ordered manner in the metal oxide doped with metal atoms when there is an electric field, and restore the disordered arrangement when a voltage is reduced or a voltage is removed, hence a current is great under a high voltage, and a current under a low voltage is a hundred times smaller than the current under the high voltage. Therefore, conductivity of the first metal oxide layer doped with metal atoms is enhanced. The second metal oxide layer is equivalent to a tunneling layer of the selector. Therefore, the second metal oxide layer facilitates reduction of the leakage current of a selector, such that the nonlinear ratio of the selector can be increased. In this way, the selector provided according to the present disclosure can provide the high current density, and the crosstalk phenomenon in a resistive random access memory array can be effectively suppressed with the 1S1R structure formed by connecting the selector and the resistive random access memory in series. Further, the selector has a high selection ratio and high durability.

Moreover, with the selector provided according to the present disclosure, a storage density can be effectively increased without increasing an area of the memory unit, such that the integration degree of the device can be improved.

Moreover, with the selector provided according to the present disclosure, a storage density can be effectively increased without increasing an area of the memory unit, such that the integration degree of the device can be improved.

In addition, a crossbar array of the selector for a bipolar resistive random access memory provided according to the present disclosure utilizes copper to achieve interconnection and the temperature during each of the fabrication processes is below 400° C. Hence, the fabrication method meets requirements of the CMOS process. Therefore, with the method for fabricating a selector for a bipolar resistive random access memory, a selector which is compatible with the CMOS process can be provided for the bipolar resistive random access memory having the 1S1R structure, thereby facilitating industrial fabrication of the bipolar resistive random access memory having the 1S1R structure.

Moreover, the selector for a bipolar resistive random access memory provided according to the embodiment of the present disclosure has an MIM (metal-insulator-metal) structure, which is much simpler and has a much smaller device area compared with a MOS device structure. Therefore, the selector can be fabricated by a simple process and is easy to be integrated with the resistive random access memory.

In the selector for a bipolar resistive random access memory and the method for fabricating the same provided in the first embodiment of the present disclosure, the substrate is not provided with an MOS device structure. Actually, in the embodiment of the present disclosure, the substrate may be provided with an MOS device. A specific implementation of fabricating a selector for a bipolar resistive random access memory on a substrate provided with an MOS device is described in a second embodiment.

Second Embodiment

Figure 6:
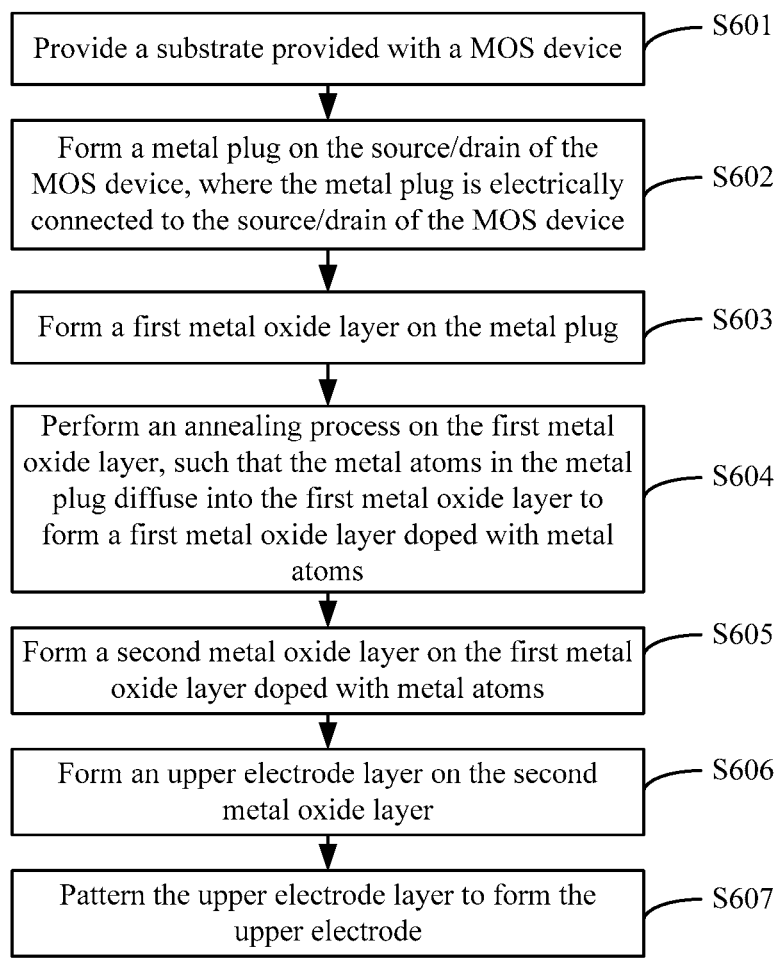
FIG. 6 is a flow chart of a method for fabricating a selector for a bipolar resistive random access memory according to a second embodiment of the present disclosure.

FIG. 6 is a flow chart of a method for fabricating a selector for a bipolar resistive random access memory according to a second embodiment of the present disclosure. As shown in FIG. 6, the method includes following steps S601 to S607.

In step S601, a substrate provided with a MOS device is provided.

Figure 7A:
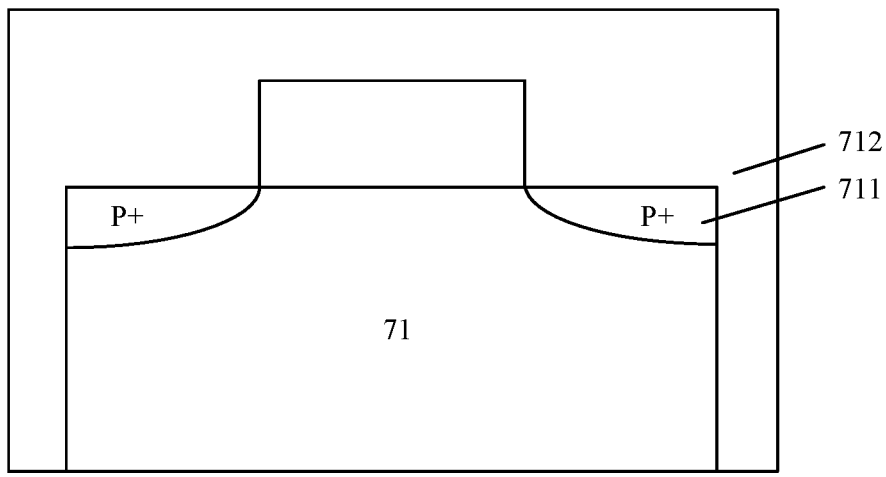

The substrate provided with the MOS device is as shown in FIG. 7A, where a MOS device 71 includes a source/drain 711 and a passivation layer 712.

In step S602, a metal plug is formed on the source/drain of the MOS device, where the metal plug is electrically connected to the source/drain of the MOS device.

As an example, in the embodiment of the present disclosure, the metal plug may be formed on the source/drain 711 of the MOS device by using a standard CMOS process. The implementation method may specifically include steps S6021 to S6024.

In step S6021, a bolt hole is formed on the source/drain of the MOS device by photolithography and etching.

The step includes: forming a bolt hole 72 in the passivation layer 712 on the source/drain 711 of the MOS device 71 by photolithography and etching. The bolt hole 72 is extended from an upper surface of the MOS device 71 to an upper surface of the source/drain. That is, the bolt hole 72 is extended from the upper surface to the lower surface of the passivation layer 712. A schematic diagram of a structure formed after step S6021 is performed is as shown in FIG. 7B1.

In step S6022, a diffusion barrier layer is formed on a bottom and a side surface of the bolt hole.

A diffusion barrier layer 73 is formed on the side surface of the bolt hole 72. A schematic diagram of a structure formed after step S6022 is performed is as shown in FIG. 7B2.

As an example, the diffusion barrier layer 73 may be made of Ti or TiN, and has a thickness ranging from 3 nm to 50 nm.

In step S6023, the bolt hole is filled with a metal, such that bolt hole is fully filled with the metal and a metal layer is formed on the bolt hole.

As an example, a PECVD (Plasma Enhanced Chemical Vapor Deposition) method may be adopted to fill the bolt hole 72 with a metal 74, such that bolt hole 72 is fully filled with the metal 74 and a metal layer 75 is formed on the bolt hole 72. The metal layer 75 may have a thickness ranging from 50 nm to 5000 nm. A schematic diagram of a structure formed after step S6023 is performed is as shown in FIG. 7B3.

Atoms that form the metal diffuse under an annealing condition of below 400° C. As an example, the metal may be copper, silver or titanium.

In step S6024, chemical-mechanical planarization is performed on the metal layer to form the metal plug.

Chemical-mechanical planarization, that is CMP, is performed on the metal layer 25 until the upper surface of the passivation layer 712 of the MOS device 71 is exposed, thereby forming a metal plug 76. A schematic diagram of a structure formed after step S6024 is performed is as shown in FIG. 7B4. It should be noted that the formed metal plug 76 is equivalent to the lower electrode of the selector for a bipolar resistive random access memory to be fabricated.

FIG. 7B4 is a cross-sectional view of a structure after the metal plug is formed on the source/drain of the MOS device by using the CMOS process. An area enclosed by the dashed box in FIG. 7B4 is an exemplary area for performing subsequent processes.

In step S603, a first metal oxide layer is formed on the metal plug.

Figure 7C:
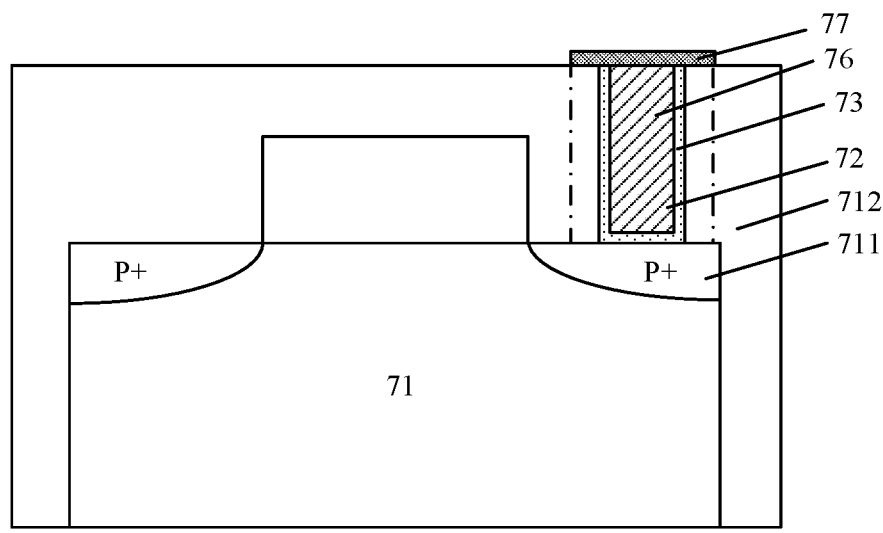

As shown in FIG. 7C, a first metal oxide layer 77 is formed on the metal plug 76.

This step is the same as step S103 in the first embodiment, and is not described in detail herein for the sake of brevity.

In step S604, an annealing process is performed on the first metal oxide layer, such that metal atoms in the metal plug diffuse into the first metal oxide layer to form a first metal oxide layer doped with metal atoms.

Figure 7D:
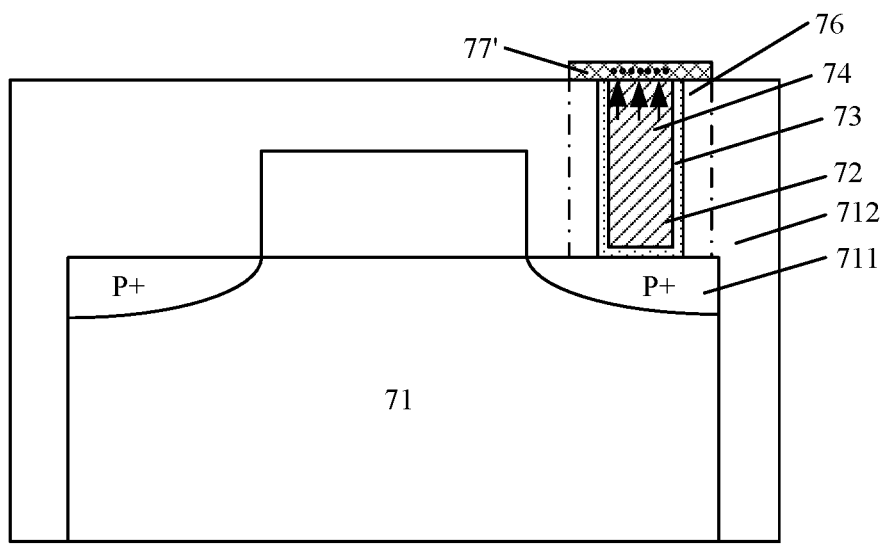

As shown in FIG. 7D, the annealing process is performed on the first metal oxide layer, such that the metal atoms in the metal plug diffuse into the first metal oxide layer 77 to form a first metal oxide layer 77' doped with metal atoms.

This step is the same as step S104 in the first embodiment, and is not described in detail herein for the sake of brevity.

In step S605, a second metal oxide layer is formed on the first metal oxide layer doped with metal atoms.

This step is the same as step S105 in the first embodiment, and is not described in detail herein for the sake of brevity.

Figure 7E:
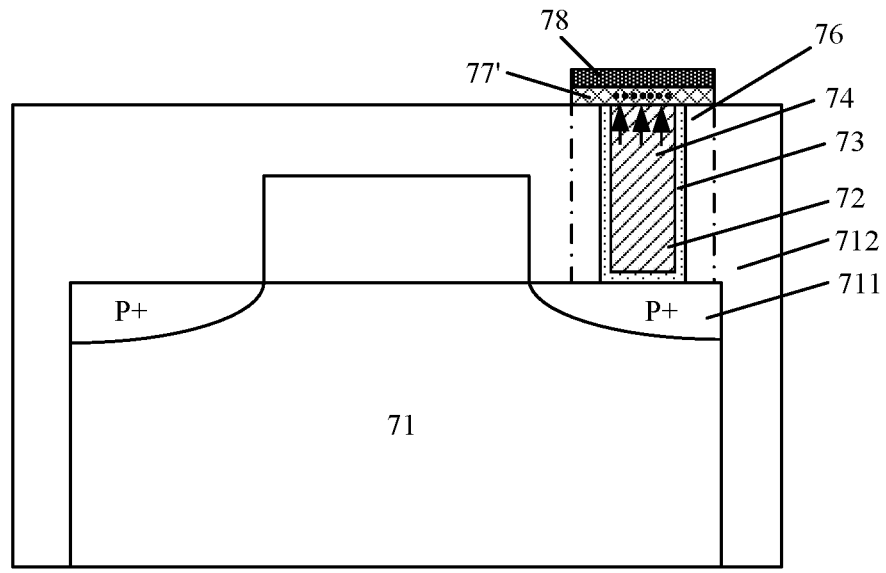

As shown in FIG. 7E, a second metal oxide layer 78 is formed on the first metal oxide layer 77' doped with metal atoms.

In step S606, an upper electrode layer is formed on the second metal oxide layer.

Figure 7F:
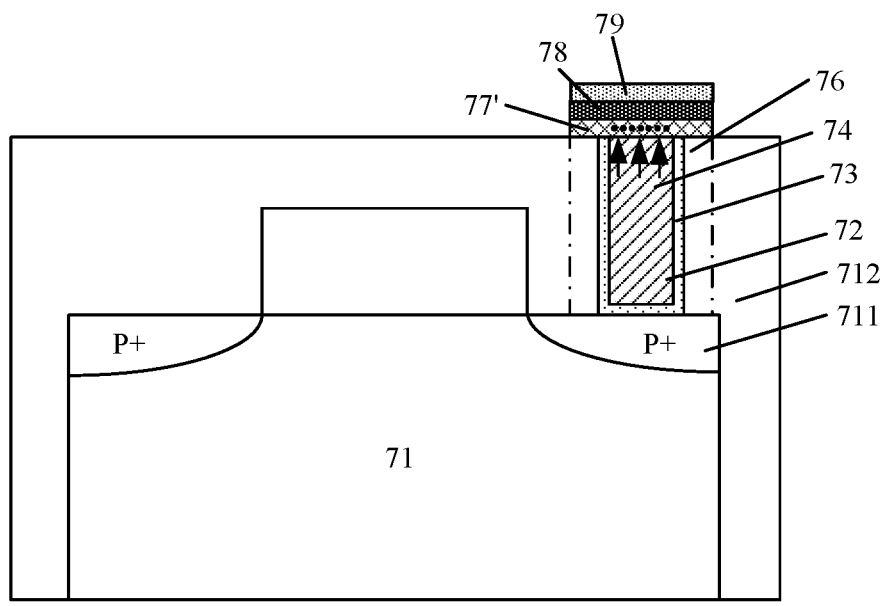

As shown in FIG. 7F, an upper electrode layer 79 is formed on the second metal oxide layer 78.

This step is the same as step S106 in the first embodiment, and is not described in detail herein for the sake of brevity.

In step S607, the upper electrode layer is patterned to form the upper electrode.

This step is the same as step S107 in the first embodiment, and is not described in detail herein for the sake of brevity.

The method for fabricating a selector for a bipolar resistive random access memory provided according to the second embodiment of the present disclosure is described above. The selector may be fabricated on a MOS transistor by using the fabrication method.

Based on the method for fabricating a selector for a bipolar resistive random access memory provided above, a selector for a bipolar resistive random access memory is further provided according to the embodiment of the present disclosure. A structure of the selector for a bipolar resistive random access memory is as shown in FIG. 7F. The selector includes a source/drain 711 of a MOS device 71, a metal plug 76, a first metal oxide layer 77' doped with metal atoms, a second metal oxide layer 78 and an upper electrode 79.

The metal plug 76 is formed on the source/drain 711 of the MOS device 71, where the metal plug 76 is electrically connected to the source/drain 711 of the MOS device. The metal plug 76 is made of a metal, where the metal is made up of atoms which diffuse under an annealing condition of below 400° C.

The first metal oxide layer 77' doped with metal atoms is formed on the metal plug 76.

The second metal oxide layer 78 is formed on the first metal oxide layer 77' doped with metal atoms.

The upper electrode 79 is formed on the second metal oxide layer 78.

What are described above are only preferred embodiments of the present disclosure. The preferred embodiments of the present disclosure are disclosed above, which should not be interpreted as limiting the present disclosure. Numerous alternations, modifications, and equivalents can be made to the technical solutions of the present disclosure by those skilled in the art in light of the methods and technical content disclosed herein without deviation from the scope of the present disclosure. Therefore, any alternations, modifications, and equivalents made to the embodiments above according to the technical essential of the present disclosure without deviation from the scope of the present disclosure should fall within the scope of protection of the present disclosure.

The invention claimed is:

1. A method for fabricating a selector for a bipolar resistive random access memory, comprising:
   providing a substrate;
   forming a lower electrode on the substrate, wherein the lower electrode is made of a metal, and the metal is made up of metal atoms which diffuse under an annealing condition of below 400° C.;
   forming a first metal oxide layer on the lower electrode;
   performing an annealing process on the first metal oxide layer so as to make the metal atoms in the lower electrode diffuse into the first metal oxide layer to form the first metal oxide layer doped with the metal atoms;
   forming a second metal oxide layer on the first metal oxide layer doped with the metal atoms;
   forming an upper electrode layer on the second metal oxide layer; and
   patterning the upper electrode layer to form an upper electrode.

2. The method according to claim 1, wherein the first metal oxide layer or the second metal oxide layer is made of at least one of $HfO_2$, $Al_2O_3$, $TaO_x$ and $TiO_x$.

3. The method according to claim 1, wherein the first metal oxide layer or the second metal oxide layer has a thickness ranging from 2 nm to 4 nm.

4. The method according to claim 1, wherein the annealing process is performed for 20 min to 40 min.

5. The method according to claim 1, wherein the annealing process is performed in an atmosphere of air.

6. The method according to claim 1, wherein the annealing process is performed at a temperature below 400° C.

7. The method according to claim 1, wherein the metal is copper, silver or titanium.

8. The method according to claim 1, wherein a MOS transistor is provided on the substrate, the MOS transistor comprises a source/drain, and the forming the lower electrode on the substrate comprises:
   forming a bolt hole on the source/drain of the MOS transistor through photolithography and etching;
   forming a diffusion barrier layer on a side wall of the bolt hole;
   filling the bolt hole with a metal, such that the bolt hole is fully filled with the metal, and a metal layer is formed on the bolt hole; and
   performing chemical-mechanical planarization on the metal layer to form a metal plug, wherein the metal plug is the lower electrode.

* * * * *